(12) United States Patent
Lu et al.

(10) Patent No.: US 11,031,255 B2
(45) Date of Patent: *Jun. 8, 2021

(54) STACK FRAME FOR ELECTRICAL CONNECTIONS AND THE METHOD TO FABRICATE THEREOF

(71) Applicant: CYNTEC CO., LTD., Hsinchu (TW)

(72) Inventors: Bau-Ru Lu, Changhua County (TW); Da-Jung Chen, Taoyuan (TW); Yi-Cheng Lin, Pingtung County (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/782,039

(22) Filed: Feb. 4, 2020

(65) Prior Publication Data
US 2020/0176270 A1  Jun. 4, 2020

Related U.S. Application Data

(63) Continuation of application No. 15/955,696, filed on Apr. 18, 2018, now Pat. No. 10,593,561, which is a
(Continued)

(51) Int. Cl.
*H01L 23/00* (2006.01)
*H01L 21/48* (2006.01)
(Continued)

(52) U.S. Cl.
CPC ...... *H01L 21/4825* (2013.01); *H01L 21/4821* (2013.01); *H01L 21/76877* (2013.01); *H01L 23/49503* (2013.01); *H01L 23/49524* (2013.01); *H01L 23/49527* (2013.01); *H01L 23/49534* (2013.01); *H01L 23/49558* (2013.01); *H01L 23/49575* (2013.01); *H01L 23/49582* (2013.01); *H01L 24/24* (2013.01); *H01L 24/32* (2013.01); *H01L 24/82* (2013.01); *H01L 25/16* (2013.01); *H01L 25/50* (2013.01); *H01L 24/29* (2013.01);
(Continued)

(58) Field of Classification Search
None
See application file for complete search history.

(56) References Cited

U.S. PATENT DOCUMENTS 5,045,918 A * 9/1991 Cagan ................. H01L 23/3135
257/747
6,661,083 B2 * 12/2003 Lee .................... H01L 23/3107
257/676
(Continued)

OTHER PUBLICATIONS

"Extend across (something)." Farlex Dictionary of Idioms. 2015. Farlex, Inc Oct. 27, 2020 https://idioms.thefreedictionary.com/extend+across+(something) (Year: 2020).*

*Primary Examiner* — Reema Patel
(74) *Attorney, Agent, or Firm* — Min-Lee Teng; Litron Patent & Trademark Office

(57) ABSTRACT

A method for forming a conductive structure is disclosed, the method comprising the steps of: forming a metallic frame having a plurality of metal parts separated from each other; forming an insulating layer on the top surface of the plurality of metal parts; and forming a conductive pattern layer on the insulating layer for making electrical connections with at least one portion of the plurality of metal parts.

18 Claims, 20 Drawing Sheets

Related U.S. Application Data continuation of application No. 15/654,703, filed on Jul. 20, 2017, now Pat. No. 9,978,611, which is a continuation of application No. 15/334,307, filed on Oct. 26, 2016, now Pat. No. 9,741,590, which is a continuation of application No. 14/821,812, filed on Aug. 10, 2015, now Pat. No. 9,514,964, which is a continuation of application No. 13/163,770, filed on Jun. 20, 2011, now Pat. No. 9,142,426.

(51) Int. Cl.
*H01L 23/495* (2006.01)
*H01L 21/768* (2006.01)
*H01L 25/00* (2006.01)
*H01L 25/16* (2006.01)

(52) U.S. Cl.
CPC .............. *H01L 24/45* (2013.01); *H01L 24/48* (2013.01); *H01L 24/73* (2013.01); *H01L 2224/215* (2013.01); *H01L 2224/24011* (2013.01); *H01L 2224/24247* (2013.01); *H01L 2224/2929* (2013.01); *H01L 2224/29339* (2013.01); *H01L 2224/32245* (2013.01); *H01L 2224/32257* (2013.01); *H01L 2224/45144* (2013.01); *H01L 2224/48247* (2013.01); *H01L 2224/73253* (2013.01); *H01L 2224/73265* (2013.01); *H01L 2224/73267* (2013.01); *H01L 2924/12042* (2013.01); *H01L 2924/1305* (2013.01); *H01L 2924/13055* (2013.01); *H01L 2924/13091* (2013.01); *H01L 2924/14* (2013.01); *H01L 2924/15153* (2013.01); *H01L 2924/19041* (2013.01); *H01L 2924/19043* (2013.01); *H01L 2924/19105* (2013.01); *H01L 2924/3011* (2013.01); *H01L 2924/30107* (2013.01); *Y10T 29/49123* (2015.01)

(56) References Cited

U.S. PATENT DOCUMENTS

| | | | |
|---|---|---|---|
| 7,071,545 B1* | 7/2006 | Patel | H01L 23/3135 257/686 |
| 9,514,964 B2* | 12/2016 | Lu | H01L 23/49524 |
| 9,741,590 B2* | 8/2017 | Lu | H01L 25/16 |
| 9,978,611 B2* | 5/2018 | Lu | H01L 23/49582 |
| 2008/0122114 A1* | 5/2008 | Lu | H01L 25/50 257/777 |

* cited by examiner

31

32

STACK FRAME FOR ELECTRICAL CONNECTIONS AND THE METHOD TO FABRICATE THEREOF

CROSS REFERENCE TO RELATED APPLICATIONS

This application is a continuation of U.S. patent application Ser. No. 15/955,696, filed Apr. 18, 2018, which is a continuation of U.S. patent application Ser. No. 15/654,703, filed Jul. 20, 2017, which is a continuation of U.S. patent application Ser. No. 15/334,307, filed Oct. 26, 2016, which is a continuation of U.S. patent application Ser. No. 14/821,812, filed Aug. 10, 2015, which is a continuation of U.S. patent application Ser. No. 13/163,770, filed Jun. 20, 2011, each of which is herein incorporated by reference in their entirety.

BACKGROUND OF THE INVENTION

I. Field of the Invention

The present invention relates to a packaging structure, and in particularly, to a metallic frame for packaging and making electrical connections.

II. Description of the Prior Art

Lead frame is a material for IC package and can be in variety of forms such as QFP, TSOP, SOT or SOJ. The molded semiconductor devices are constructed by assembling and interconnecting a semiconductor device to a lead frame. The structure is often molded with plastic material. A lead frame is made by a metal ribbon with a paddle (also known as a die paddle, die-attach tab, or island) for attaching a semiconductor device thereto and a plurality of leads arranged in a manner such that the leads do not overlap the paddle on which the semiconductor device is to be mounted.

Conventionally, lead frame is used for die bond of an IC chip. The process flow includes many stages which are wire bond, molding of IC chip, and the tests after trimming or forming. Various products can be made by integrating or packaging the lead frame with other devices such as inductors or capacitors. It's one of the main packaging processes in the industry due to its easiness, maturity and better reliability. However, such kind of conventional process has many disadvantages including: a. higher cost and more development works of molding devices; b. poor capability in area design which is only in the form of plane so that product size doesn't shrink; and c. lacking of modular capability as it is only good for packaging a single device.

Accordingly, the present invention proposes a stack frame and its manufacturing method to overcome the above-mentioned disadvantages.

SUMMARY OF THE INVENTION

One objective of the present invention is to provide a method of forming a stack frame for manufacturing a structure for electrical connections. By removing one or more portions of the metallic substrate, a metallic frame having a plurality of pins is formed. The conductive pattern is formed on the metallic frame to make a plurality of electrical connections to connect with a plurality of pins. Because metallic frame is metallic, it has better performance in heat dissipation and electrical conductance.

Another objective of the present invention is to provide a method of forming a lead frame for manufacturing a package structure for electrical connections. The conductive pattern is formed on the lead frame to make the electrical connections to the plurality of pins. Because the lead frame is metallic, it has better performance in heat dissipation and electrical conductance.

One embodiment in the present invention is to form a recess is in the metallic frame and at least one conductive element is bonded in the recess. I/O terminals of a conductive element can be electrically connected to a conductive layer by conventional technology, such as wire bond, gold-ball bond, conductive wires (by film process, printing process, electroplating) or a combination thereof.

The structure can be used in IC package in which a first conductive element is encapsulated mainly in the metallic frame, not molded with plastic material; and a second conductive element can be mounted on the metallic frame by SMT. The first conductive element and the second conductive element can be active elements, such as IC chip, MOSFET, IGBT or diode, or passive elements, such as resistors, capacitors or inductors. The first conductive element and the second conductive element are directly electrically connected to the metallic frame (or pin), so it doesn't need additional PCB in order to connect them. Moreover, dispensing or gluing are used to replace molding encapsulation for protection of the first conductive element. Therefore, it does not need additional development of molding devices; it can save time and cost; and it's easier for design. Compared with lead frame and molding in conventional structure of IC package, the structure can make the shortest electrical path for connecting the components so that it can reduce total impedance and increase electrical efficiency.

Another embodiment of the present invention is to use both top and bottom surfaces of metallic frame to make another structure for electrical connections.

In one embodiment, a method for forming a conductive structure is disclosed, the method comprising the steps of: forming a metallic frame having a plurality of metal parts separated from each other; forming an insulating layer on the top surface of the plurality of metal parts; and forming a conductive pattern layer on the insulating layer for making electrical connections with at least one portion of the plurality of metal parts.

In one embodiment, the plurality of metal parts comprise a supporting metal body and a plurality of metal pins adjacent to the supporting metal body, wherein each of the plurality of metal pins is spaced apart from the supporting metal body.

In one embodiment, the method further comprising forming at least one via in the insulating layer, wherein the conductive pattern layer electrically connects with the plurality of metal pins through the at least one via.

In one embodiment, wherein forming the metallic frame is by removing one or more portions of a metallic substrate so as to form said gap between each of the plurality of metal pins and the supporting metal body.

In one embodiment, wherein forming a conductive pattern is performed by a film process.

In one embodiment, wherein forming a conductive pattern is performed by a thin film process.

In one embodiment, the method further comprising forming a filling layer to fill gaps between the metal body and the plurality of pins, wherein the filling layer is different from the insulating layer.

In one embodiment, wherein the insulating layer extends into gaps between the metal body and the plurality of pins.

In one embodiment, wherein the height of the supporting metal body is the same as the height of each of the plurality of metal pins.

In one embodiment, the method further comprising the step of: placing a first conductive element having a least one first I/O terminal over the metallic frame, wherein the conductive pattern layer further electrically connects with said at least one first I/O terminal of the second conductive element.

In one embodiment, the method further comprising the steps of: forming a recess in the supporting metal body; and placing a first conductive element having at least one first I/O terminal in the recess, wherein the conductive pattern layer further electrically connects with said at least one first I/O terminal of the first conductive element.

In one embodiment, the method further comprising the step of: placing a second conductive element having a least one second I/O terminal over the metallic frame, wherein the conductive pattern layer further electrically connects with said at least one second I/O terminal of the second conductive element.

In one embodiment, wherein a polymer material comprises photoresist material.

In one embodiment, wherein the metal substrate is made of at least one of Cu, Ag or Sn.

In one embodiment, wherein the first conductive element comprises at least one of IC chip, MOSFET, IGBT, diode, choke, capacitor or resistor.

In one embodiment, wherein the first conductive element comprises at least one of IC chip, MOSFET, IGBT, diode, choke, capacitor or resistor.

In one embodiment, wherein the second conductive element comprises at least one of IC chip, MOSFET, IGBT, diode, choke, capacitor or resistor.

In one embodiment, wherein the metal substrate is disposed on a supporting layer, the method further comprising the steps of: removing the supporting layer after the gaps between the supporting metal body and the plurality of metal pins are filled; and forming a second pad underlying the metallic frame.

In one embodiment, wherein the top surface of the first conductive element and the top surface of the metallic frame are substantially at the same horizontal level.

In one embodiment, a top surface of the supporting metal body and a top surface of each of the plurality of metal pins are substantially at the same horizontal level.

In one embodiment, wherein forming the insulating layer on the top surface of the metallic frame further comprising forming at least one via in the insulating layer, wherein the conductive pattern layer electrically connects with at least one of the plurality of metal pins and the at least one first I/O terminal of the first conductive element via the at least one via.

In one embodiment, wherein forming the insulating layer on the top surface of the lead frame further comprising forming at least one via in the insulating layer, wherein the conductive pattern layer electrically connects with at least one of the plurality of metal pins and the at least one first I/O terminal of the first conductive element via the at least one via.

The present invention also discloses forming a filling layer to fill a least one vacancy of the metallic frame. The filling layer can be a polymer material layer which can not only fill vacancies of the metallic frame but also cover the metallic frame.

Accordingly, the polymer material layer can also be patterned on the stack frame so that the conductive layer can be contacted with the polymer material layer. As a result, it can reduce the overall process cost.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

The invention discloses a method for manufacturing a stack frame. A stack frame means a frame on which something is constructed to combine some more functionality.

Figure 1:
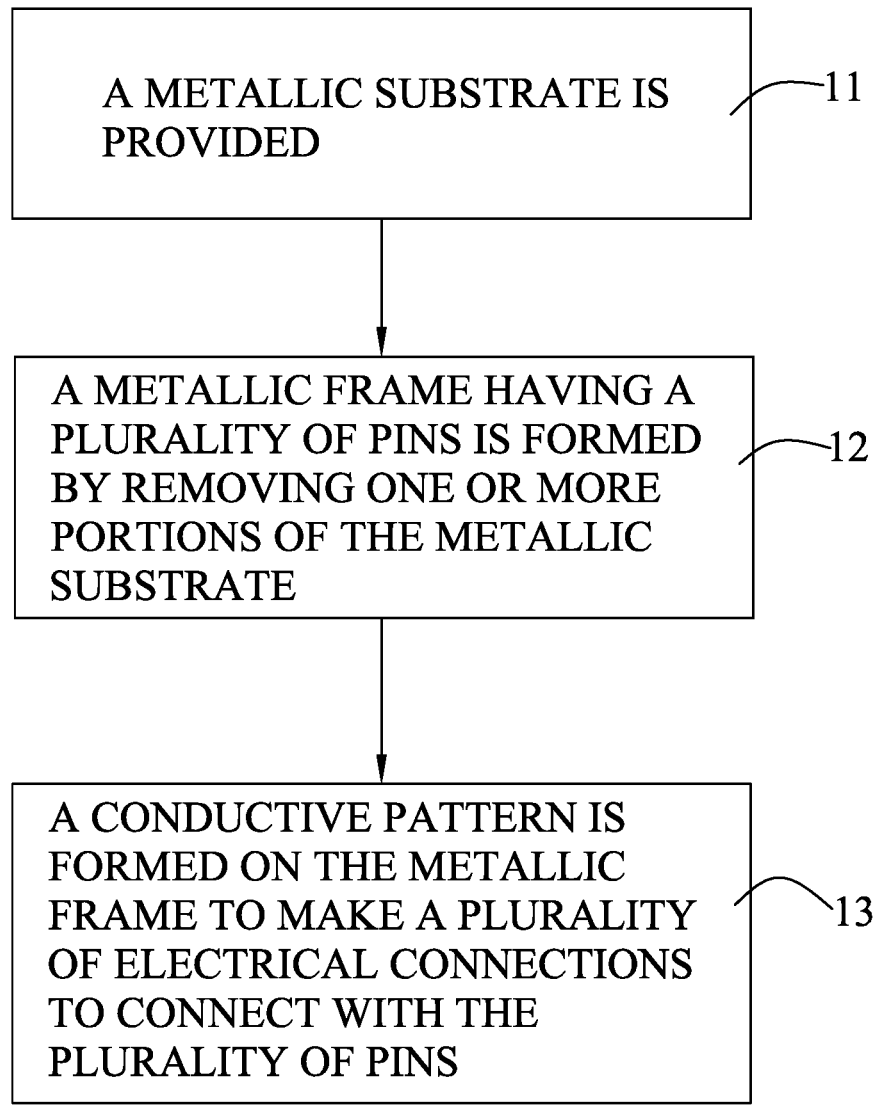
FIG. 1 is a process flow of a method for manufacturing a structure for electrical connection.

Please refer to FIG. 1, a method for manufacturing a stack frame is achieved by the following steps:

In step 11, a metallic substrate is provided.

In step 12, a metallic frame having a plurality of pins is formed by removing one or more portions of the metallic substrate.

In step 13, a conductive pattern is formed on the metallic frame to make a plurality of electrical connections to connect with the plurality of pins.

In step 11, the metallic substrate can be made of any conductive material, such as metallic material which includes and is not limited, Cu, Ag, Sn or a combination thereof. In step 12, the technology for removing one or more portions of the metallic substrate to form a metallic frame having a plurality of pins can be any known method. A metallic frame has a plurality of pins as I/O terminals, and pads are placed underlying pins for external electrical connection. The metallic frame can be a lead frame or any other equivalent structure. In one embodiment, the metallic frame can have no vacancy or at least one vacancy. Appearance or shape of the metallic frame depends on layout of pads via which the pin of the metallic frame is electrically connected to PCB or another conductive element, such as IC chip, MOSFET, IGBT, diode, resistor, choke or capacitor. In step 13, a conductive pattern is formed on the metallic frame by known techniques, such as film process, printing process, laser drilling or a combination thereof. The conductive pattern comprises a plurality of electrical connections to connect with the plurality of the plurality of pins. In one embodiment, at least one conductive layer is patterned on the metallic frame to make better performance of the electrical connections to the plurality of pins.

Figure 2A:
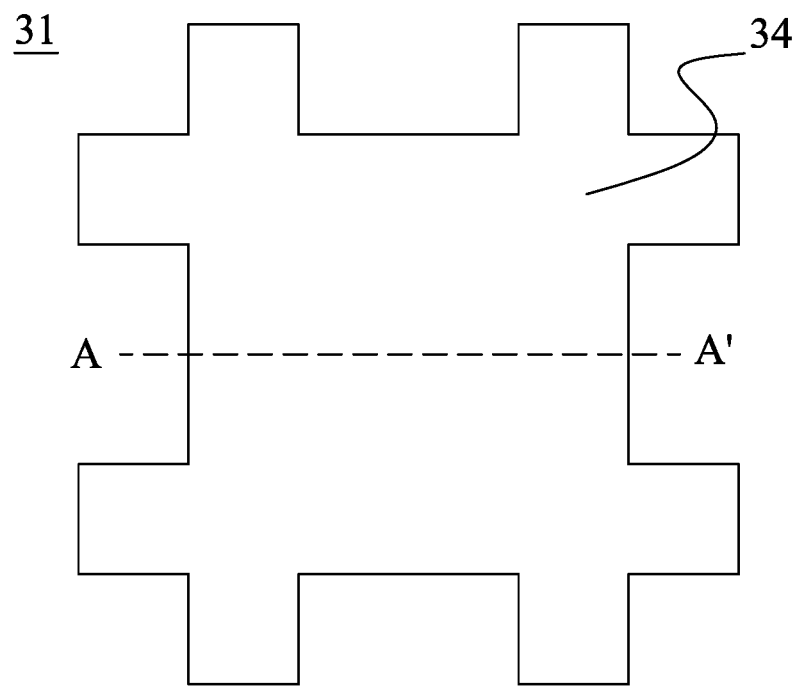
FIG. 2A and FIG. 2B illustrate a top view of stack frame with no vacancy and a top view of stack frame with at least one vacancy respectively.
Figure 2B:
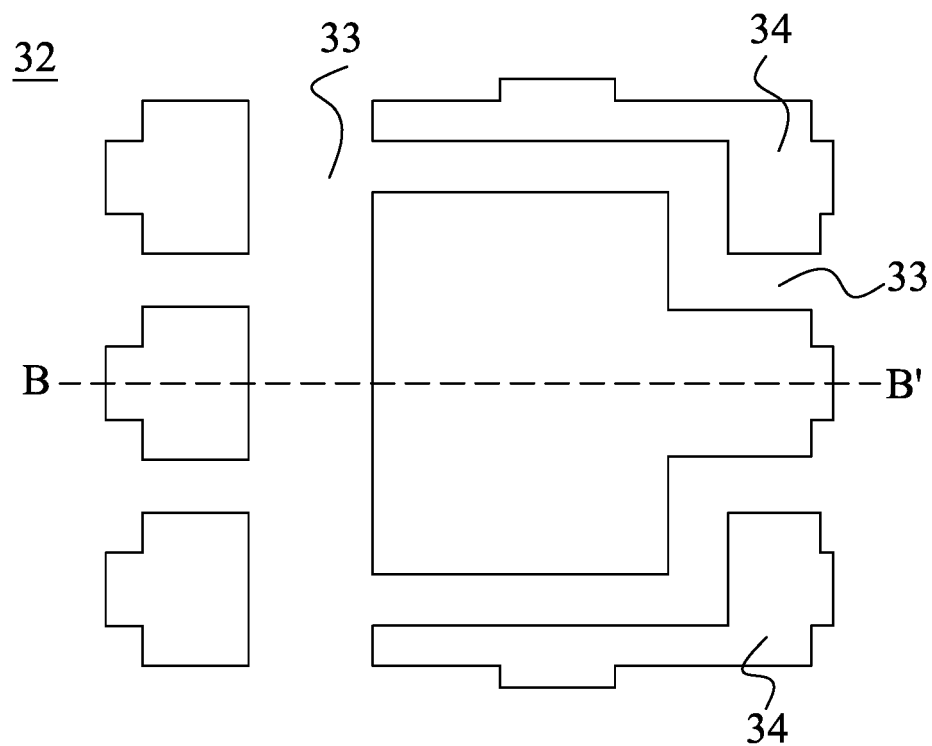
Figure 2C:
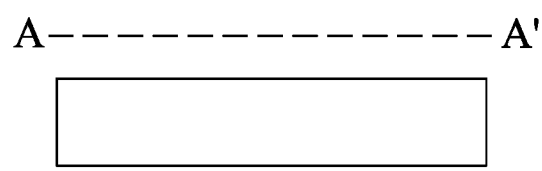
FIG. 2C and FIG. 2D illustrate a schematic cross-sectional view of of stack frame with no vacancy and a schematic cross-sectional view of stack frame with at least one vacancy respectively.
Figure 2D:
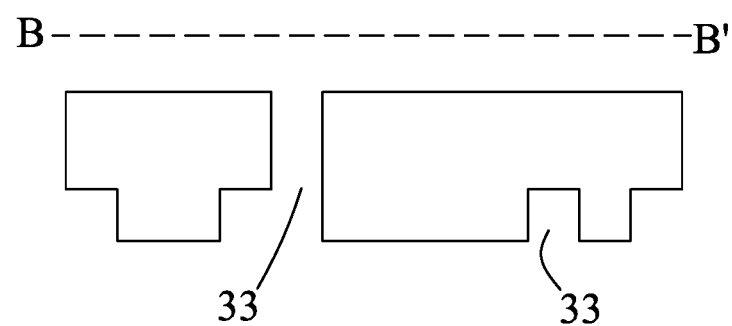

FIG. 2A and FIG. 2B illustrate a top view of metallic frame 31 with no vacancy and a top view of metallic frame 32 with at least one vacancy 33 respectively. Metallic frame having a plurality of pins 34 can be in any suitable appearance or shape for subsequent processing. FIG. 2C and FIG. 2D illustrate a schematic cross-sectional view of a metallic frame 31 with no vacancy and a schematic cross-sectional view of a metallic frame 32 with a vacancy 33 respectively. In reference to both FIG. 2A and FIG. 2C together, sections A-A' in FIG. 2C are taken along line A-A' shown in FIG. 2A. In reference to both FIG. 2B and FIG. 2D together, sections B-B' in FIG. 2D are taken along line B-B' shown in FIG. 2B. The preferred structures and manufacturing method are described in the following embodiments.

First Embodiment

Figure 3A:
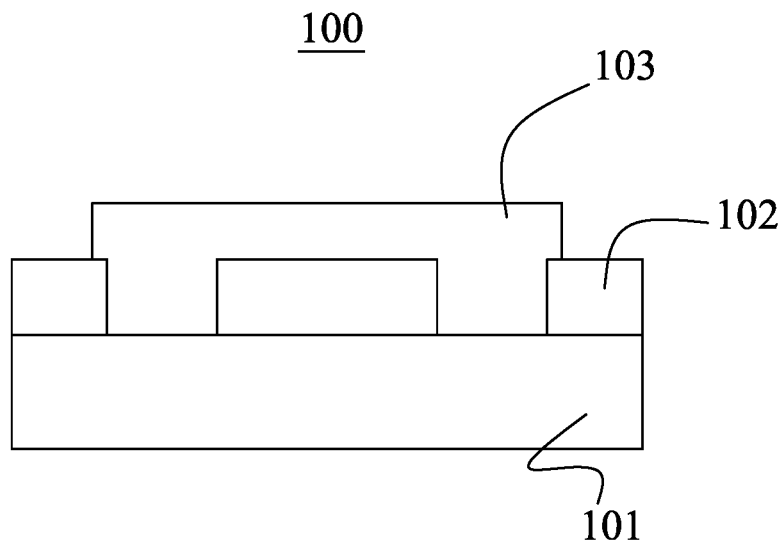
FIG. 3A illustrates a schematic cross-sectional view of the structure of stack frame with no vacancy for electrical connections.
Figure 3B:
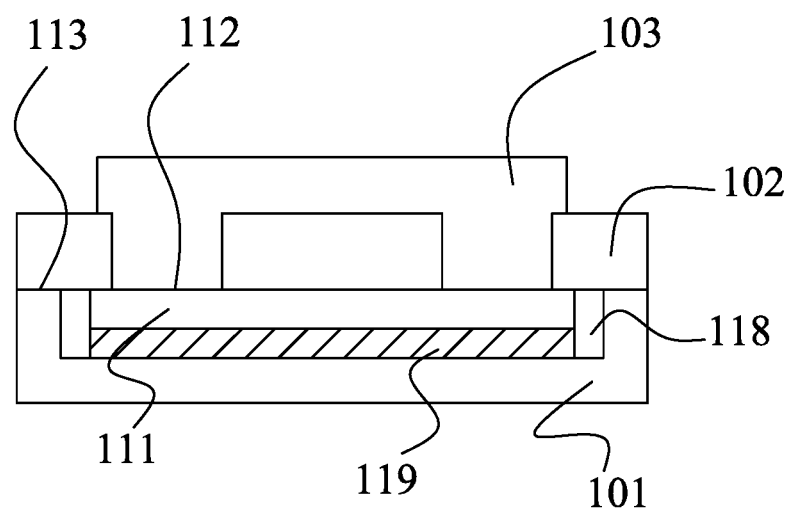
FIG. 3B illustrates a schematic cross-sectional view of the structure of stack frame with no vacancy and with a recess in which a conductive element is bonded for electrical connections.
Figure 3C:
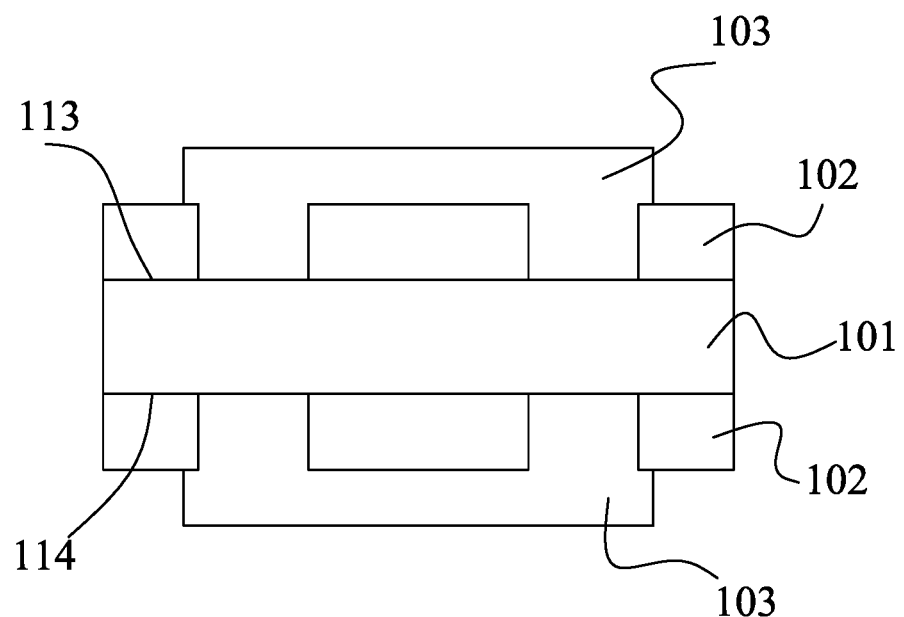
FIG. 3C illustrates a schematic cross-sectional view of the structure of stack frame with no vacancy for electrical connections by process both on the top surface and the bottom surface of the structure.

FIG. 3A illustrates a schematic cross-sectional view of a structure 100 of stack frame with no vacancy for electrical connections. In one embodiment, the structure 100 includes a metallic frame 101 with no vacancy, a dielectric layer 102 and a conductive layer 103. The dielectric layer 102 is disposed on the metallic frame 101. The conducted layer 103 is formed on the dielectric layer 102 and filled into vias which are formed inside of the dielectric layer 102. The structure 100 can include any other equivalent structure for electrical connections as well; and the structure can be made of any suitable material by any suitable process. In another embodiment, as illustrated in FIG. 3B, a recess 118 is formed in the metallic frame 101 and a conductive element 111 (e.g., IC chip, MOSFET, IGBT, diode, resistor, choke or capacitor) is bonded in the recess 118 by conventional techniques (e.g., Ag gluing 119). There are many different ways to locate the recess, for example, in one embodiment the recess is formed inside of the metallic frame; in another embodiment the recess is formed with one side aligned with one edge of the metallic frame; and in yet another embodiment the recess is formed with two sides aligned with two edges of the metallic frame respectively. In one embodiment, the recess can be formed in the metallic frame which comprises a plurality of sub metallic frames, wherein a plurality of sub metallic frames are joined together. In one embodiment, at least one conductive element is bonded in the recess. I/O terminals of the conductive element 111 can be electrically connected to the conductive layer 103 by conventional technology, such as wire bond, gold-ball bond, conductive wires (by film process, printing process or electroplating) or a combination thereof. In one embodiment, the top surface 112 of the conductive element and the top surface 113 of metallic frame are at the same horizontal level. In yet another embodiment, as illustrated in FIG. 3C, the process can be performed on both top surface 113 and bottom surface 114 of metallic frame. The features described above can also be applied to the structure in FIG. 3C.

Figure 3D:
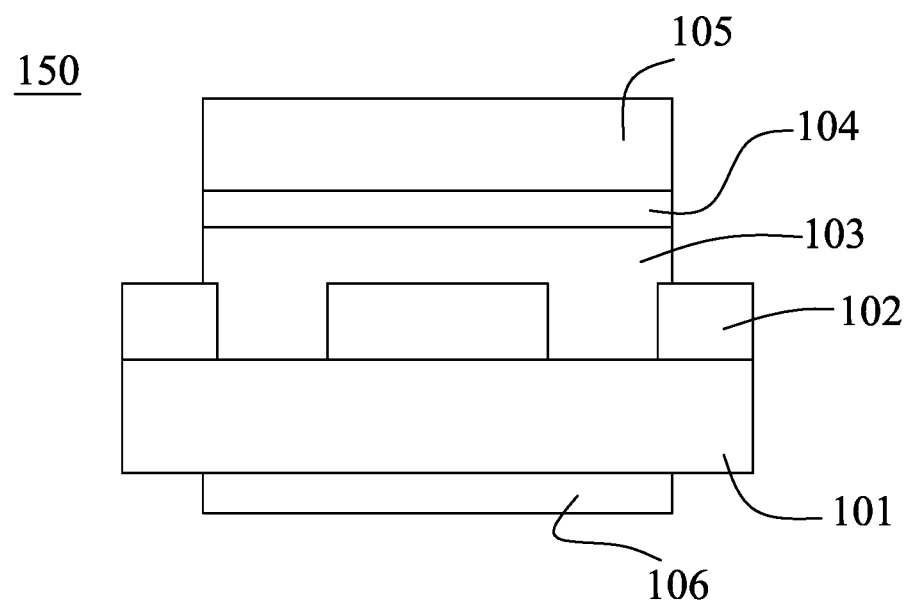
FIG. 3D illustrates a product structure with at least one first conductive element on the structure in FIG. 3A.

FIG. 3D illustrates a product structure 150 with a first conductive element 105 on the structure 150 in FIG. 3A. A first pad 104 can be formed on the conductive layer 103 so that a conductive element 105 (e.g., IC chip, MOSFET, IGBT, diode, resistor, choke or capacitor) can be placed on the first pad 104. A second pad 106 can be formed underlying the pins of the stack frame. The second pad 106 can be made of any conductive material, such as Sn, Ni/Au or the like. The structure 150 can be mounted on PCB or electrically connected to another conductive element (not shown) (e.g., IC chip, MOSFET, IGBT, diode, resistor, choke or capacitor) so that the conductive element 105 can be electrically connected to PCB or another conductive element (not shown) via the conductive path including the first pad 104, the conductive layer 103, metallic frame (or pin) 101 and a second pad 106. It should be noted that the way to make electrical connections varies with different kinds of products and process performed on the metallic frame. It can include many ways and is not limited to the ways described above. It can be readily appreciated by those skilled in the art and thus will not be further described herein.

Second Embodiment

Figure 4A:
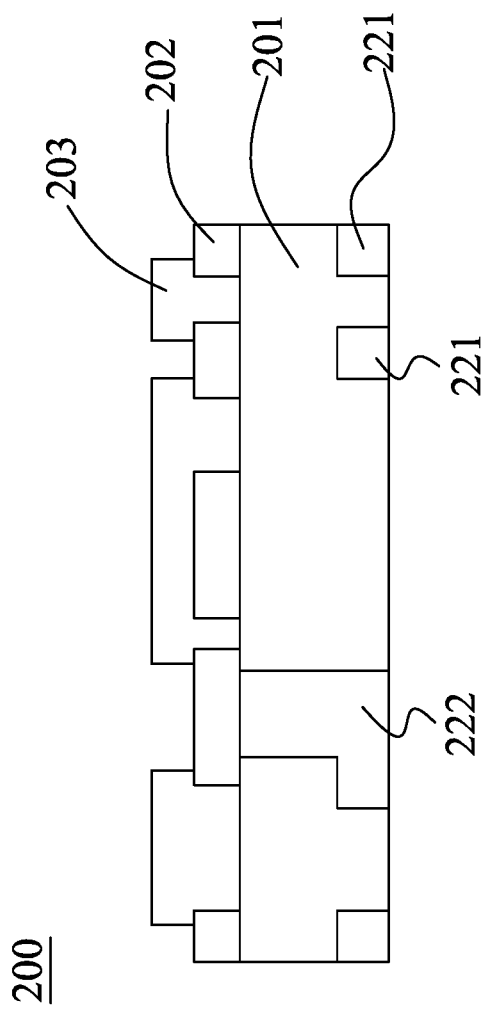
FIG. 4A illustrates a schematic cross-sectional view of the structure of stack frame with at least one vacancy for electrical connections.
Figure 4B:
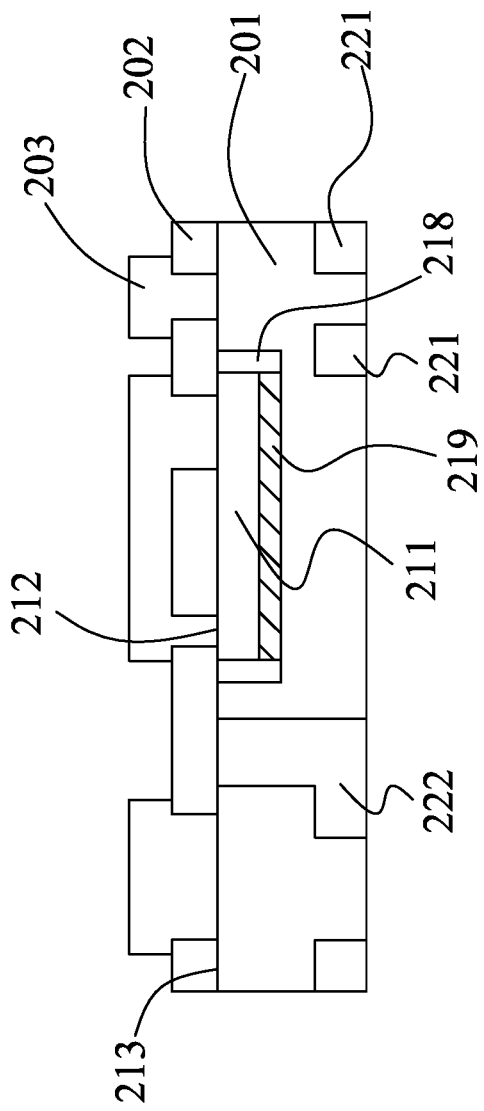
FIG. 4B illustrates a schematic cross-sectional view of the structure of stack frame with at least one vacancy and with a recess in which a conductive element is bonded for electrical connections.
Figure 4C:
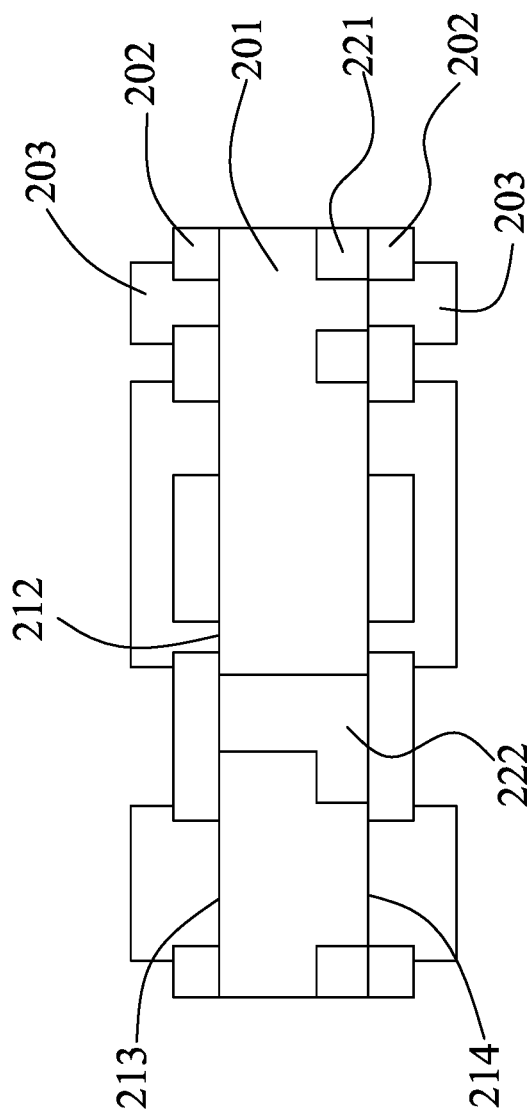
FIG. 4C illustrates a schematic cross-sectional view of the structure of stack frame with at least one vacancy for electrical connections by process on both the top surface and the bottom surface of the structure.

FIG. 4A illustrates a schematic cross-sectional view of the structure 200 of stack frame with at least one vacancy 221 for electrical connections. In one embodiment, the structure includes a metallic frame 201 with at least one vacancy 221, a dielectric layer 202 and a conductive layer 203. The filling layer 222 is filled with a least one vacancy 221 of the metallic frame. The dielectric layer 202 is disposed on the metallic frame 201 and the conducted layer 203 is formed on the dielectric layer 202 and filled into vias which are formed inside of the dielectric layer 202. The structure 200 can include any other equivalent structure for electrical connections. The structure can be made of any suitable material and can be made by any suitable process. In another embodiment, as illustrated in FIG. 4B, a recess 218 is formed in the metallic frame 201 and at least one conductive element 211 (e.g., IC chip, MOSFET, IGBT, diode, resistor, choke or capacitor) is bonded in the recess 218 by conventional techniques (e.g., Ag gluing 219). There are many different ways to locate the recess, for example, in one embodiment the recess is formed inside of the metallic frame; in another embodiment the recess is formed with one side aligned with one edge of the metallic frame; and in yet another embodiment the recess is formed with two sides aligned with two edges of the metallic frame respectively. In one embodiment, the recess can be formed in the metallic frame which comprises a plurality of sub metallic frames, wherein a plurality of sub metallic frames are joined together. In one embodiment, at least one conductive element is bonded in the recess. I/O terminals of the conductive element 211 can be electrically connected to the conductive layer by conventional technology, such as wire bond, gold-ball bond, conductive wires (by film process, printing process or electroplating) or a combination thereof. In one embodiment, the top surface 212 of the conductive element and the top surface 213 of metallic frame are at the same horizontal level. In yet another embodiment, as illustrated in FIG. 4C, the process can be performed on top surface 213 and bottom surface 214 of metallic frame.

Figure 4D:
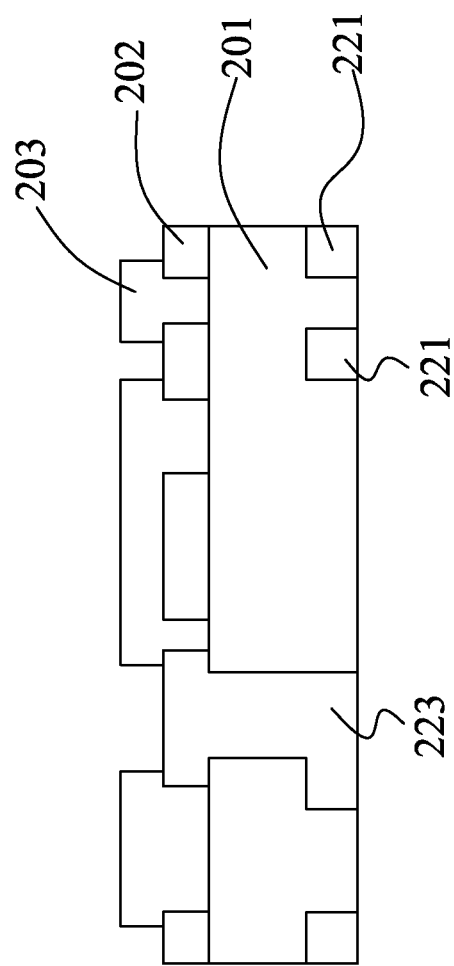
FIG. 4D illustrates another schematic cross-sectional view of the structure of stack frame with at least one vacancy for electrical connections.

Please refer back to FIG. 3A, there is a structural difference between FIG. 3A and FIG. 4A. The metallic frame of the structure 100 in FIG. 3A has no vacancy; whereas the metallic frame of the structure 200 in FIG. 4A has at least one vacancy 221 which can be filled by the filling layer 222. In one embodiment, the filling layer can fill at least one vacancy 202 of the metallic frame 201 and cover the metallic frame 201. The filling layer 222 includes any suitable material, such as a polymer material or the like. The polymer material includes a photoresist. In one embodiment, underlying the metallic frame is a supporting layer (not shown), such as polyimide film (PI film), which can support the filling layer 222. At the end of the overall process, the supporting layer can be removed. In one embodiment, supporting layer is not necessary. In one embodiment, please refer to FIG. 4D, the filling layer and the dielectric layer can be a single layer 223. In one preferred embodiment, the single layer 223 is a polymer material layer (e.g., photoresist or negative photoresist). The polymer material layer not only can fill the vacancies but also can be patterned on the metallic frame by some known techniques, such as lithography process, laser drilling or the like, so that the conductive layer 203 can be contacted with the polymer material layer. Accordingly, the overall processing cost can be reduced. Furthermore, the features described above in FIG. 4B and FIG. 4D can also be applied to the structure in FIG. 4C as well.

Figure 4E:
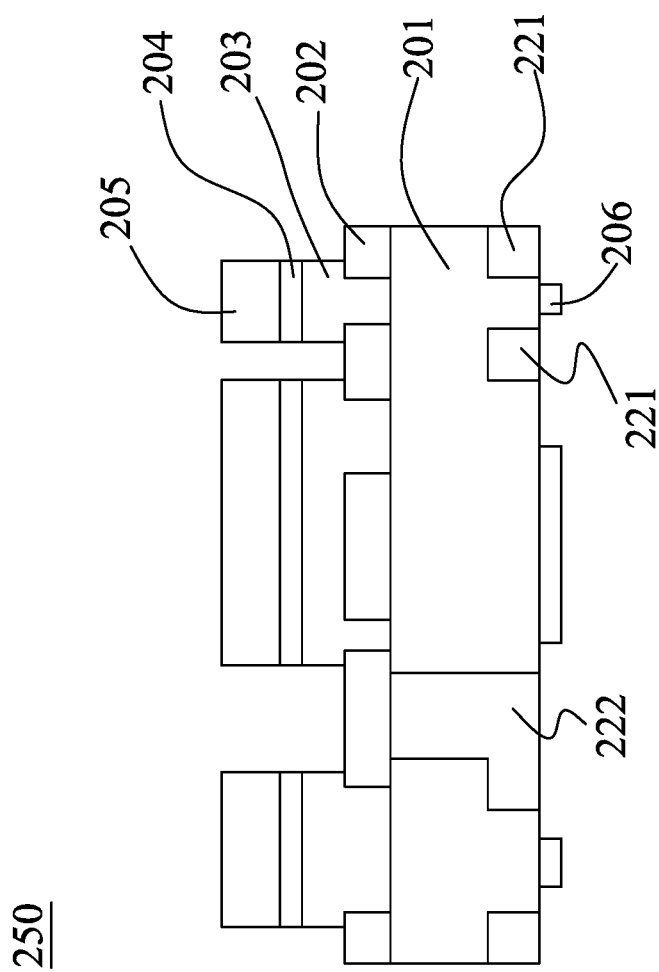
FIG. 4E illustrates a product structure with at least one first conductive element on the structure in FIG. 4A.

FIG. 4E illustrates another product structure 250 with a first conductive element 205 on the structure 200 in FIG. 4A. A first pad 204 is formed on the conductive layer 203 so that a conductive element 205 (e.g., IC chip, MOSFET, IGBT, diode, resistor, choke or capacitor) can be placed on the first pad 204. A second pad 206 can be formed underlying the pins of the stack frame. The second pad 206 can be made of any conductive material, such as Sn, Ni/Au or the like. The structure 250 can be mounted on PCB or electrically connected to another conductive element (not shown) (e.g., IC chip, MOSFET, IGBT, diode, resistor, choke or capacitor) so that the first conductive element 205 can be electrically connected to a PCB or another conductive element (not shown) via the conductive path including the first pad 204, the conductive layer 203, metallic frame (or pin) 201 and a second pad 206. It should be noted that the way to make electrical connections varies with different kinds of products and process performed on the metallic frame. It can include many ways and is not limited to the ways discussed above. It can be readily appreciated by those skilled in the art and thus will not be further described herein.

The following embodiment discloses a package structure and its manufacturing method. In the embodiment, the metallic frame is a lead frame and the lead frame is the main constituent of the package structure.

Third Embodiment

Figure 5A:
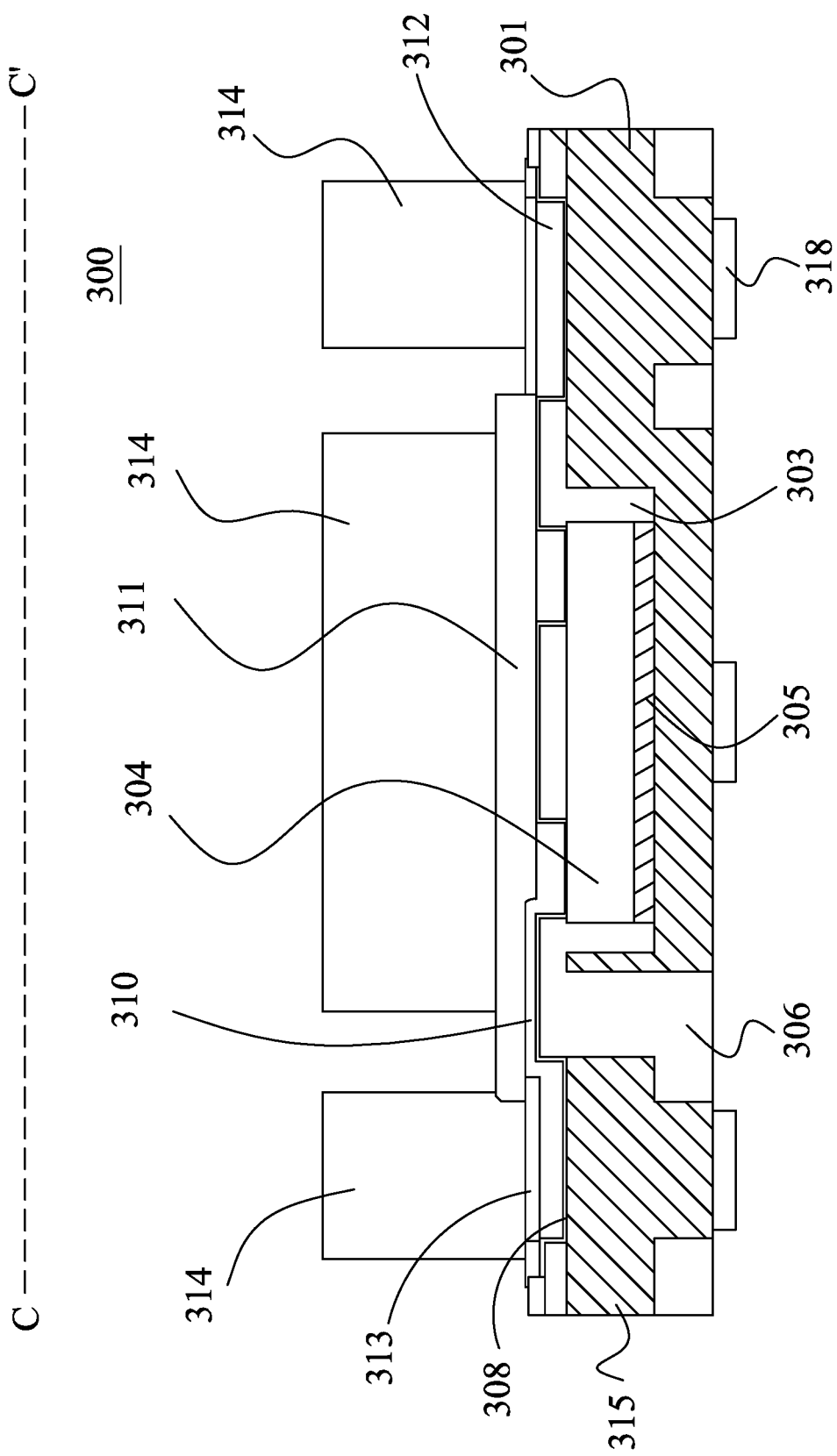
FIG. 5A illustrates a sectional view of the package structure of the embodiment of the present invention.

FIG. 5A illustrates a sectional view of the package structure 300. The package structure 300 includes a lead frame 301, a filling layer 306, a first conductive element 304, a conductive pattern 312, a protective layer 311, a conductive pad 313, and at least one second conductive element 314. A lead frame has a plurality of pins 315 which can be in many forms, such as I/O terminals or pads (not shown) which are placed underlying pins 315 for external electrical connection. The appearance or shape of the lead frame depends on the layout of the pads via which the structure 300 is electrically connected to PCB or a third conductive element (not shown), such as IC chip, MOSFET, IGBT, diode, resistor, choke or capacitor. In one embodiment, the lead frame 301 can have no vacancy or at least one vacancy. The structure 300 can include any other equivalent structure for a package structure, and it can be made of any suitable material and manufactured by any suitable process. A lead frame 301 can be made of conductive material, such as Ag, Cu, Sn or a combination thereof. A conductive pattern 312 is formed on the lead frame 301 by some known techniques, such as film process, printing process, laser drilling or a combination thereof. In one embodiment, at least one conductive layer is patterned on the lead frame 301 to make better performance of a plurality of electrical connections to the pins 315.

One aspect of structural difference between lead frames lies in whether it has vacancy or not. Besides that, the remaining of the structure of lead frame are almost the same. The preferred structures and manufacturing method in the following description refer to performing the film process on the lead frame which has at least one vacancy.

FIG. 5B to FIG. 5H illustrate a sectional view of process flow for manufacturing the package structure 300.

Figure 5B:
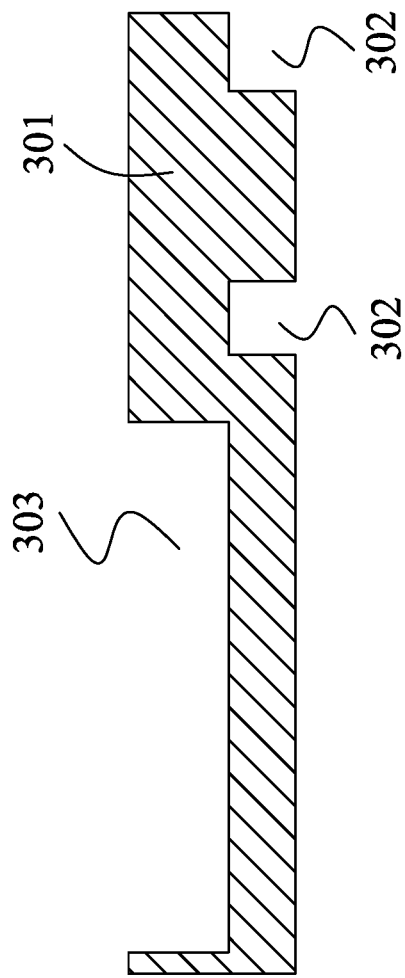
FIG. 5B to FIG. 5J illustrates a process flow for manufacturing a package structure of the present invention.

As illustrated in FIG. 5B, a recess 303 is formed in the lead frame 301 with at least one vacancy 302. The recess 303 can be formed by a known technology, such as etching or surface coarsening. There are many different ways to locate the recess, for example, in one embodiment the recess is formed inside of the lead frame; in another embodiment the recess is formed with one side aligned with one edge of the lead frame; and in yet another embodiment the recess is formed with two sides aligned with two edges of the lead frame respectively. In one embodiment, the recess can be formed in the lead frame which comprises a plurality of sub lead frames, wherein a plurality of sub lead frames are joined together.

Figure 5C:
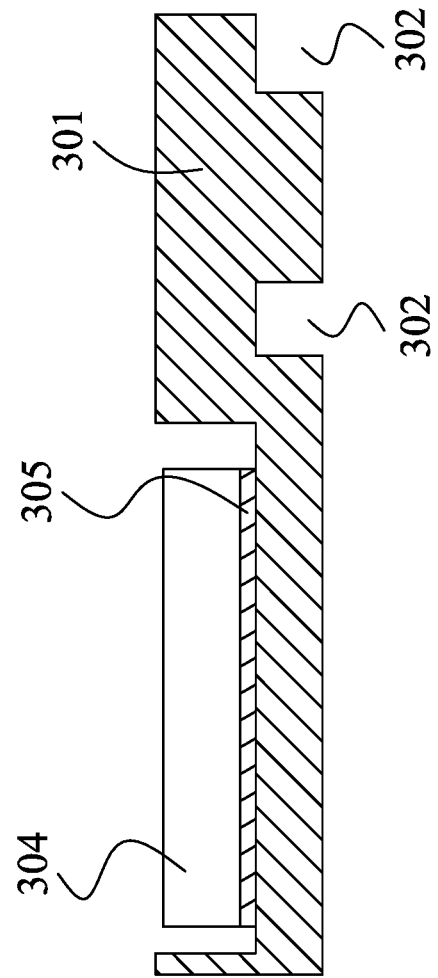

Next, as illustrated in FIG. 5C, a first conductive element 304, such as IC chip, MOSFET, IGBT or diode, is bonded in the recess 303 by conventional techniques (e.g., Ag gluing 305). In one embodiment, at least one first conductive element is bonded in the recess.

Figure 5D:
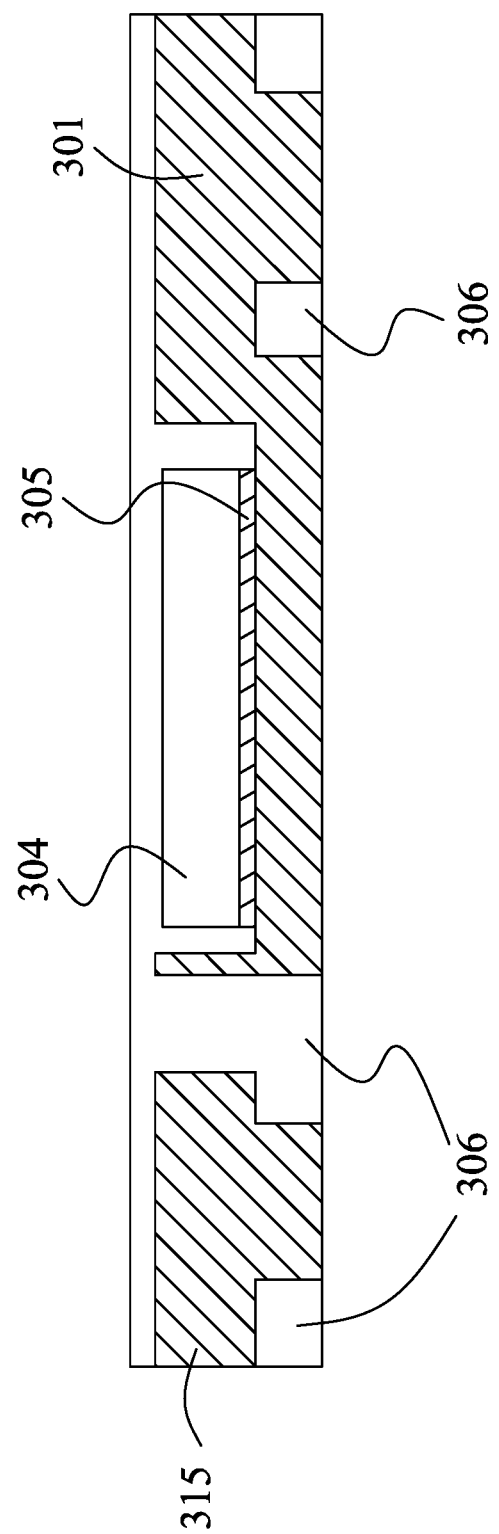

Next, as illustrated in FIG. 5D, the filling layer 306 is filled into at least one vacancy 302 of the lead frame 301. In one embodiment, the filling layer can fill at least one vacancy 302 of the lead frame 301 and cover the lead frame 301. A supporting layer, such as polyimide film (PI film), is attached underlying the lead frame 301 to support the filling layer 306. At the end of the overall process, the supporting layer can be removed. In one embodiment, supporting layer is not necessary. The filling layer 306 includes any suitable material, such as a polymer material or the like. The polymer material can be a photoresist. In the preferred embodiment, the filling layer 306 is a polymer material layer (e.g., photoresist or negative photoresist). The polymer material layer not only can fill a plurality of vacancies but also can be patterned on the lead frame 301 by known techniques, such as lithography process, laser drilling, so that the conductive pattern 312 can be contacted with the polymer material layer.

Figure 5E:
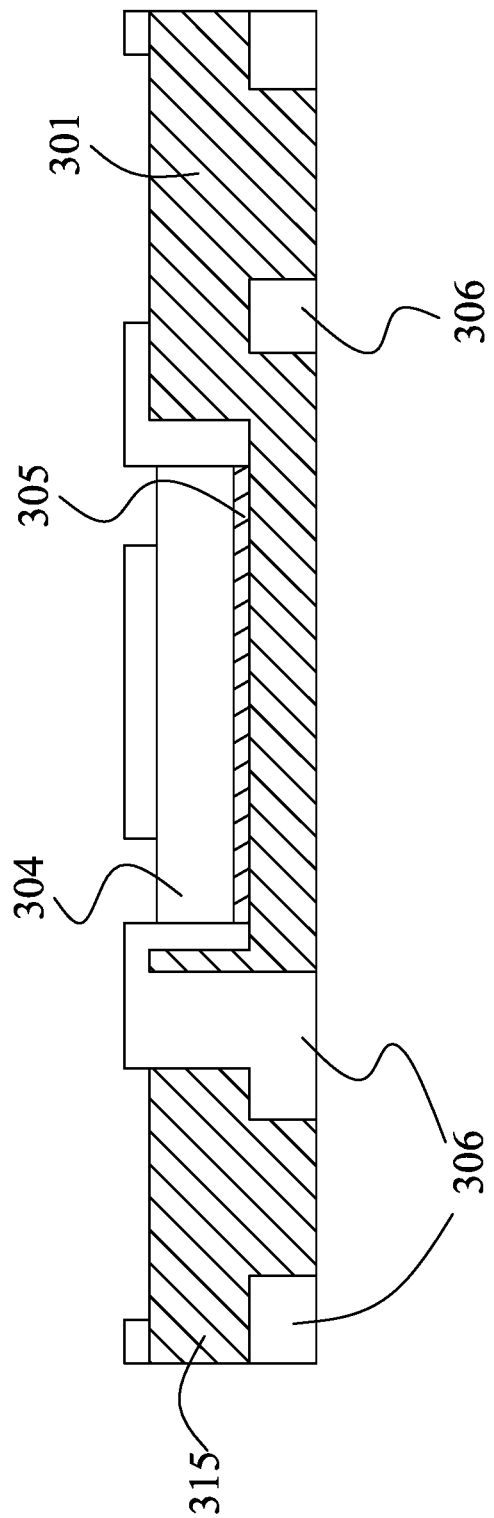

Please refer to FIG. 5E, a polymer material (e.g., photoresist or negative photoresist) layer 306 is patterned to expose the I/O terminals of the first conductive element 304 by a known process, such as lithography process, laser drilling or the like. A conductive pattern 312, which will be discussed in next stage, is formed on the lead frame.

Figure 5F:
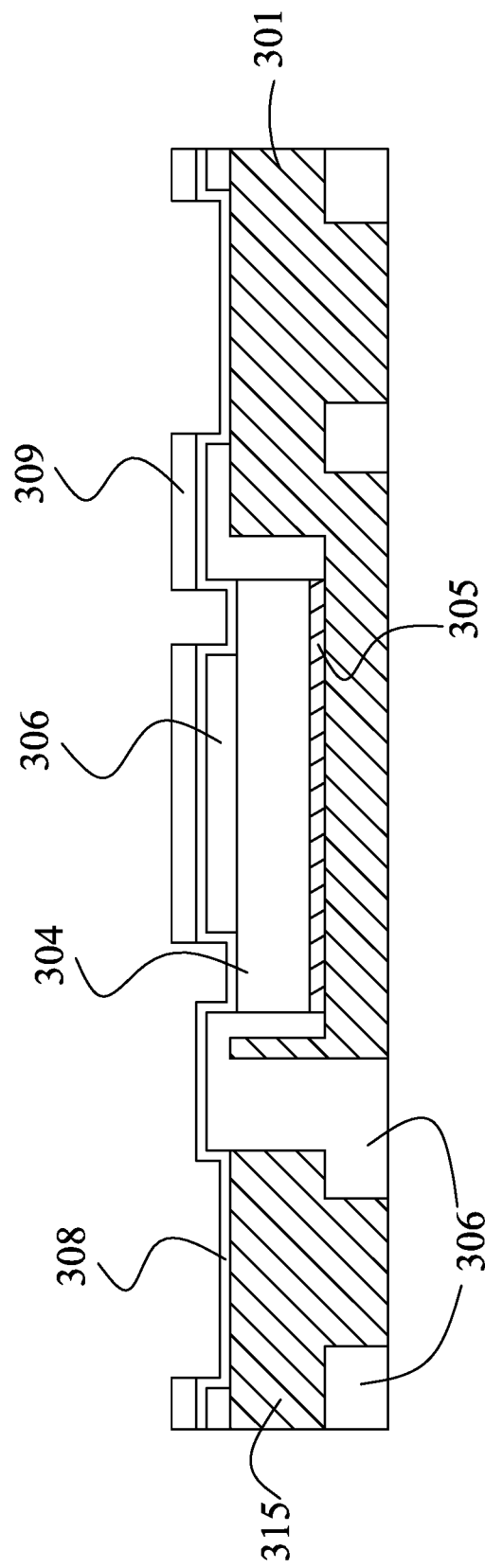
Figure 5G:
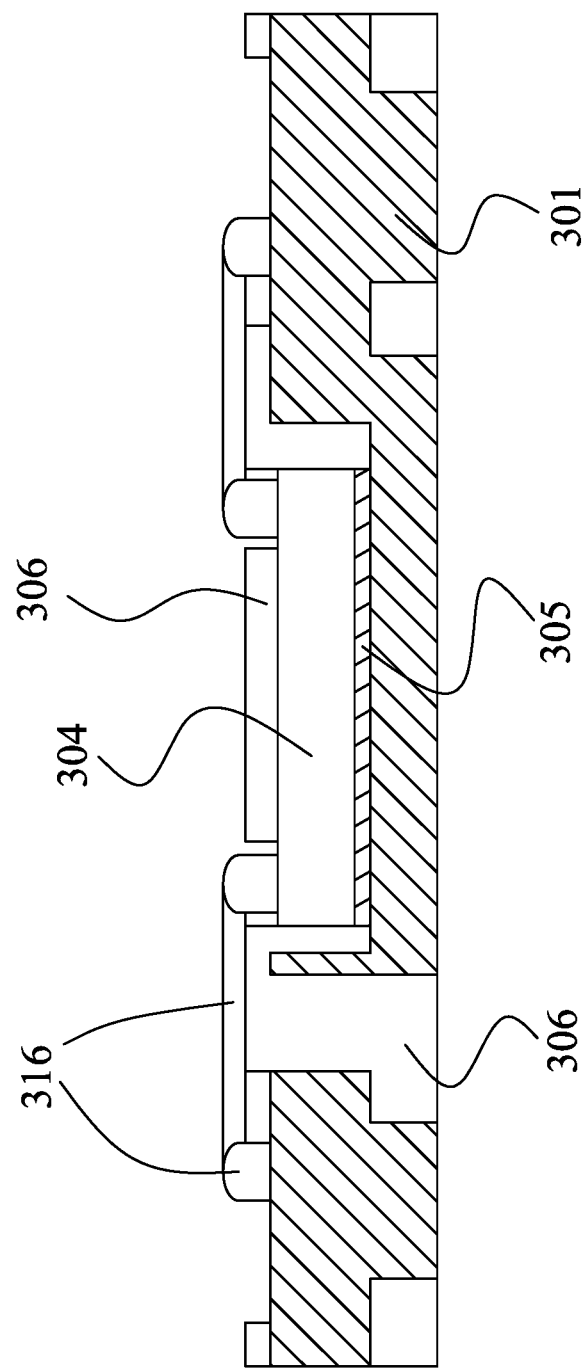
Figure 5H:
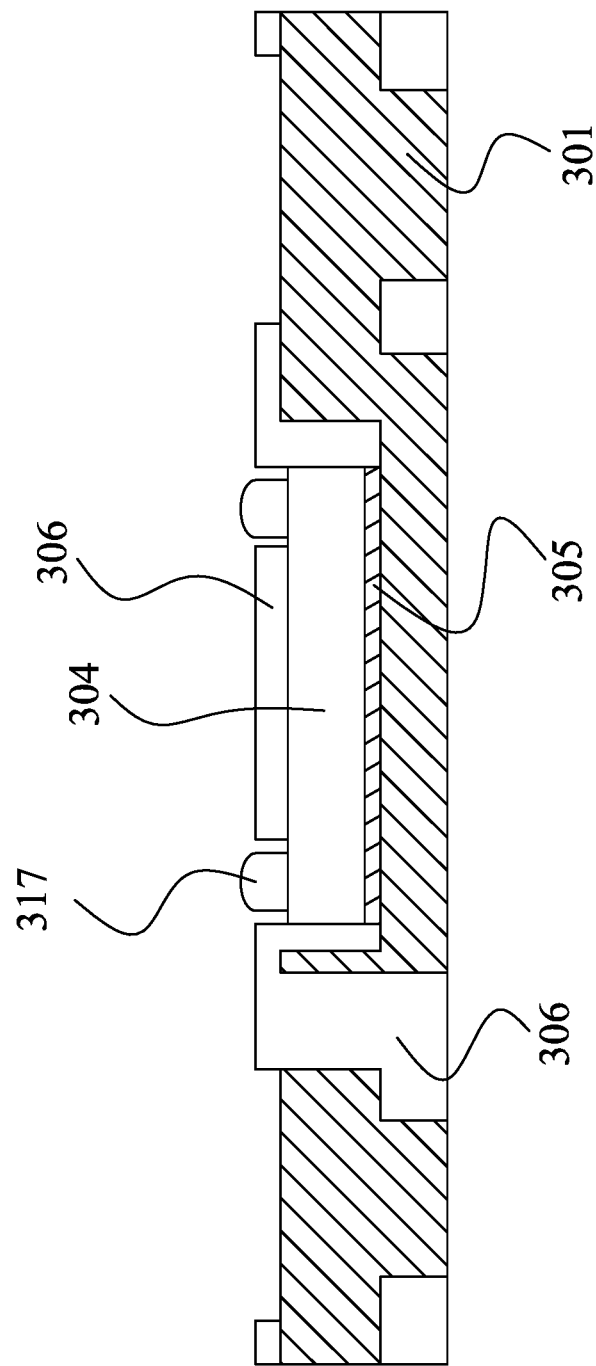
Figure 5I:
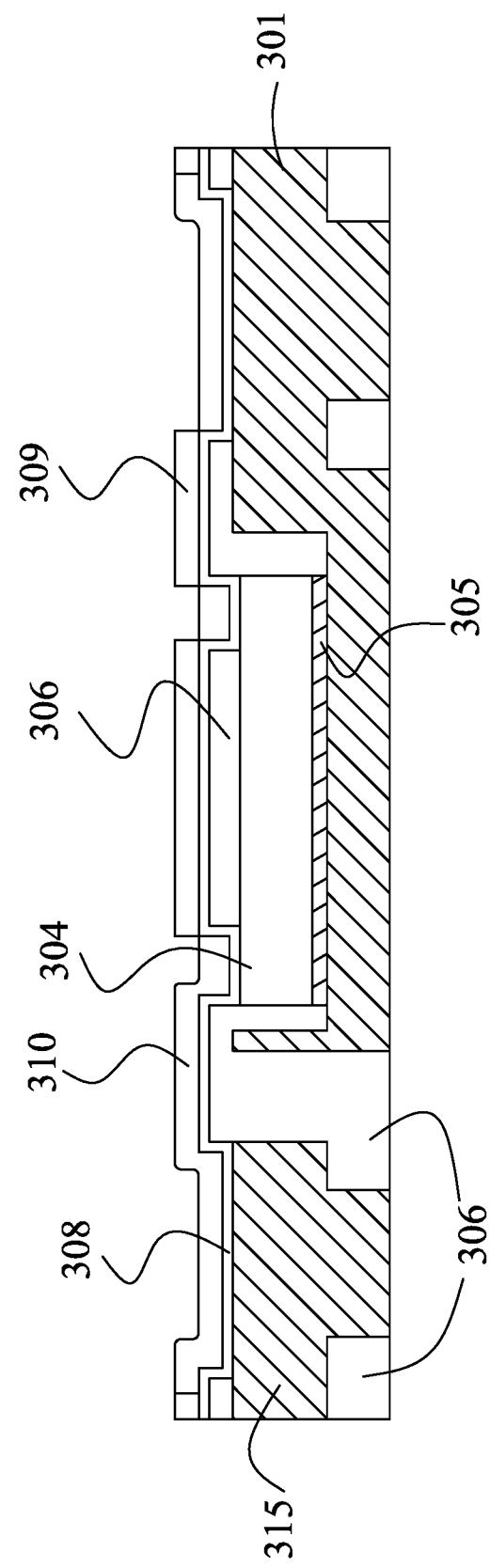

Next, as illustrated in FIG. 5F and FIG. 5I, a thin copper layer 308 is sputtered over the polymer material layer 306, a portion of pins of the lead frame 315 and I/O terminals of the first conductive element 304. A thin copper layer 108 and a thick copper layer 310 (shown in FIG. 5I) are combined into a conductive pattern 312 to make two groups of electrical connections. The first group of electrical connections is between a portion of pins of lead frame 315 and I/O terminals of the first conductive element 304. The second group of electrical connections is between the second conductive element 314 and I/O terminals of the first conductive element 304. A thin copper layer 308 is used to contact I/O terminals of the first conductive element 304 to reduce the contact resistance between I/O terminals of the first conductive element 304 and the conductive pattern 312.

Please continuously refers to FIG. 5F and FIG. 5I A photoresist layer 309 (e.g., positive photoresist) is patterned on a portion of thin copper layer 108 to expose the remaining portion of thin copper layer 308. Then a thick copper layer 310 is formed on the remaining portion of thin copper layer 308 by a known process, such as electroplating. As a result, a thin copper layer 308 and a thick copper layer 310 (shown in FIG. 5I) are combined into a conductive pattern 312 to make two groups of electrical connections described above.

In one embodiment, I/O terminals of the first conductive element 304 can be electrically connected to the conductive pattern 312 by conventional technology, such as wire bond, gold-ball bond, conductive wires (by film process, printing process, or electroplating) or a combination thereof. FIG. 5H and FIG. 5G illustrate electrical connections between the I/O terminal of the first conductive element 304 and the conductive pattern 312 by way of wire bonds 316 or gold ball bonds 317. A gold-ball bond is used to contact I/O terminals of the first conductive element 304 to reduce contact resistance between I/O terminals of the first conductive element 304 and the conductive pattern 312.

Figure 5J:
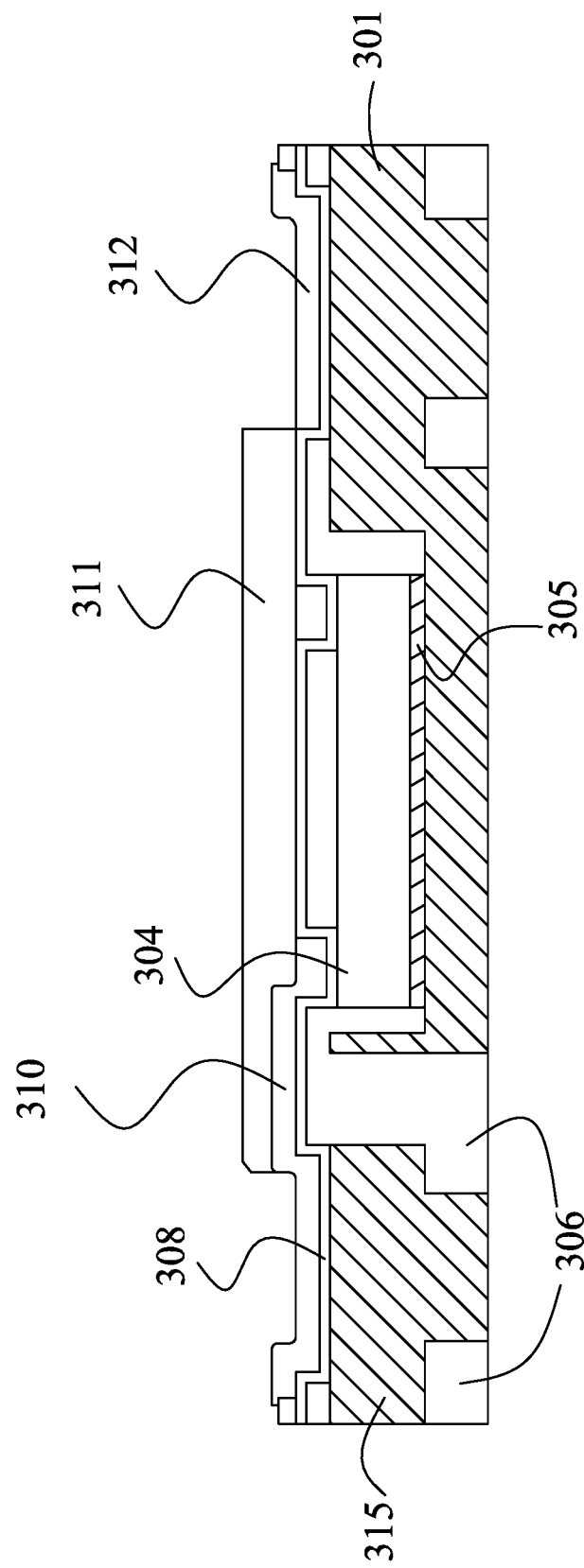

Next, as illustrated in FIG. 5J and FIG. 5A, the photoresist layer 309 is removed. In one embodiment, the thick copper layer 310 can be trimmed to a suitable thickness. Then, a protective layer 311 is selectively patterned to expose a portion of the conductive pattern 312. A first pad 313 can be formed on the portion of the conductive pattern 312 by a known process, such as printing solder, to connect with a second conductive element 314, such as choke, capacitor or resistor. Then a second pad 318 can be formed underlying the lead frame to further connect to PCB. The second pad 318 can be made of any conductive material, such as Sn, Ni/Au or the like. FIG. 5A illustrates a product structure 300 of the embodiment of the present invention.

Figure 5K:
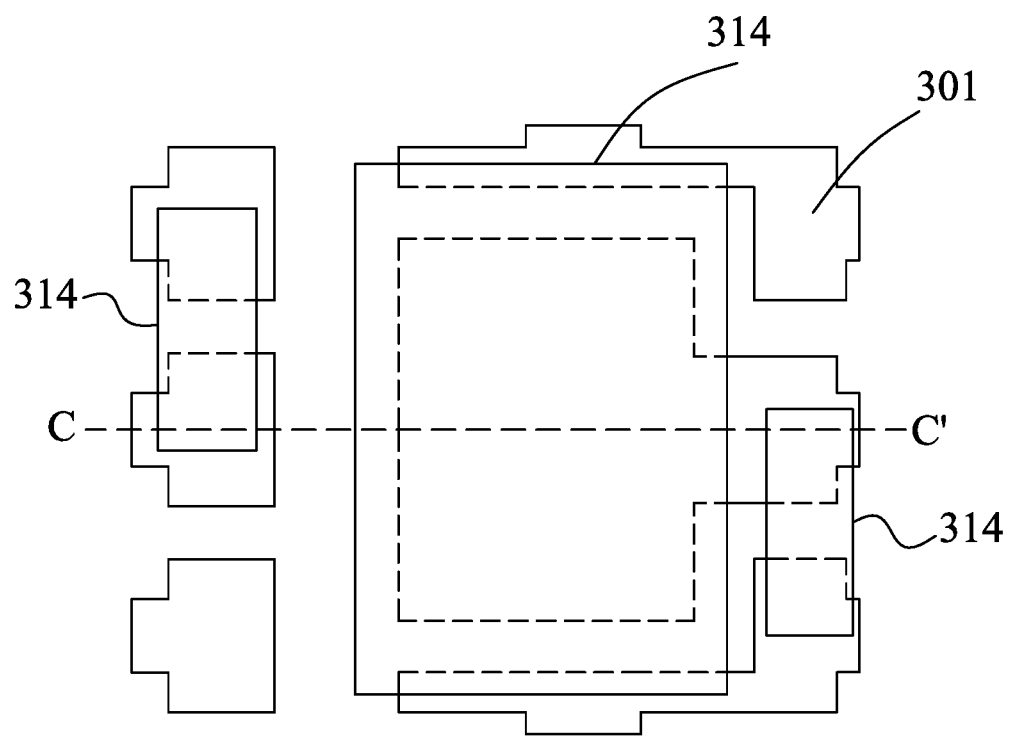
FIG. 5K illustrates the top view of the package structure in FIG. 5A.
Figure 5L:
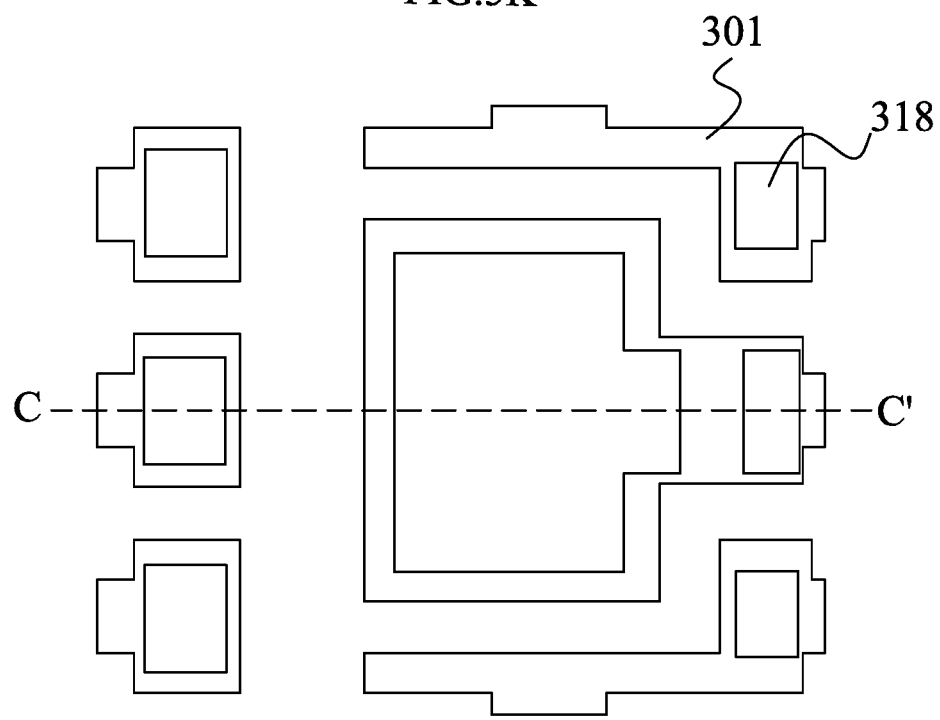
FIG. 5L illustrates the bottom view of the package structure in FIG. 5A.

FIG. 5K and FIG. 5L illustrate the top view and bottom view of the product structure 300 in FIG. 5A. In reference to both FIG. 5A and FIG. 5K together, sections C-C' in FIG. 5A are taken along line C-C' shown in FIG. 5K. In reference to both FIG. 5A and FIG. 5L together, sections C-C' in FIG. 5A are taken along line C-C' shown in FIG. 5L. As illustrated in FIG. 5K, the top view of the product structure 300 mainly includes a lead frame 301 and a second conductive element 314 in FIG. 5A. As illustrated in FIG. 5L, the bottom view of the product structure 300 mainly includes a lead frame 301 and a second pad 318 in FIG. 5A. The first conductive element (not shown) 304 is embedded in the product structure 300. It should be noted that the way to make electrical connections varies with different kinds of products and process performed on the metallic frame. It can include many ways and is not limited to the ways discussed above. It can be readily appreciated by those skilled in the art and thus will not be further described herein.

It follows from description of the above embodiments that the structure in the present invention and the method for manufacturing the same can offer many advantages including: 1. Better performance of heat dissipation and electrical conductance as the metallic frame is metallic. 2. Smaller size by forming a recess in the metallic frame and using conventional technology and process, such as film process, printing process or electroplating, to connect all the conductive elements by a conductive pattern with the metallic frame. 3. Versatile applications including active devices such as IC chip, MOSFET, IGBT or diode, or passive devices such as resistors, capacitors or inductors.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for forming a conductive structure, the method comprising:
    forming a lead frame having a plurality of pins, wherein a recess is formed in the lead frame;
    disposing an electronic device in the recess;
    forming an insulating layer over the lead frame and the electronic device, wherein the insulating layer physically contacts the recess and a top surface of the lead frame that is adjacent to the recess; and
    forming at least one conductive pattern layer over the insulating layer, wherein the at least one conductive pattern layer comprises a plurality of electrical connections to connect with the plurality of pins and at least one first I/O terminal of the electronic device.

2. The method according to claim 1, further comprising forming at least one via in the insulating layer, wherein the at least one conductive pattern layer electrically connects with at least one pin of the plurality of pins and the at least one first I/O terminal of the electronic device via the at least one via.

3. The method according to claim 1, wherein the lead frame comprise a supporting metal body and the plurality of pins adjacent to the supporting metal body, wherein each of the plurality of pins is spaced apart from the supporting metal body.

4. The method according to claim 3, further comprising forming a filling layer to fill a vacancy between the metal body and the plurality of pins, wherein the filling layer is different from the insulating layer.

5. The method according to claim 3, wherein the insulating layer extends into a vacancy between the metal body and the plurality of pins.

6. The method according to claim 1, wherein forming the at least one conductive pattern layer is performed by a film process.

7. The method according to claim 1, wherein the recess is formed inside of the lead frame.

8. The method according to claim 1, wherein the recess is formed with one side aligned with one edge of the lead frame.

9. The method according to claim 1, wherein the recess is formed with two sides aligned with two edges of the lead frame respectively.

10. A method for forming a conductive structure, the method comprising:
   forming a metallic frame having a plurality of metal parts separated from each other, wherein a recess is formed in the metallic frame;
   disposing an electronic device in said recess;
   forming an insulating layer over the plurality of metal parts and the electronic device, wherein the insulating layer is extended across a top surface of the metallic frame and the recess, wherein the insulating layer extends into a vacancy between the plurality of metal parts; and
   forming at least one conductive pattern layer over the insulating layer, wherein the at least one conductive pattern layer comprises a plurality of electrical connections to connect with at least one metal part of the plurality of metal parts and at least one first I/O terminal of the electronic device.

11. The method according to claim 10, further comprising forming at least one via in the insulating layer, wherein the at least one conductive pattern layer electrically connects with the at least one metal part of the plurality of metal parts and the at least one first I/O terminal of the electronic device via the at least one via.

12. The method according to claim 10, wherein the plurality of metal parts comprise a supporting metal body and a plurality of metal pins adjacent to the supporting metal body, wherein each of the plurality of metal pins is spaced apart from the supporting metal body.

13. The method according to claim 10, wherein forming the metallic frame is by removing one or more portions of a metallic substrate so as to form a vacancy between each two adjacent metal parts.

14. The method according to claim 10, wherein forming the at least one conductive pattern layer is performed by a film process.

15. The method according to claim 10, wherein forming the at least one conductive pattern layer is performed by a thin-film process.

16. The method according to claim 12, wherein the insulating layer extends into vacancies between the metal body and the plurality of metal pins.

17. The method according to claim 12, wherein a top surface of the supporting metal body and a top surface of each of the plurality of metal pins are substantially at the same horizontal level.

18. A method for forming a conductive structure, the method comprising:
   forming a lead frame having a plurality of pins, wherein a recess is formed in the lead frame;
   disposing a conductive element in the recess;
   forming an insulating layer over the lead frame and the conductive element, wherein the insulating layer extends into a vacancy between the plurality of pins; and
   forming at least one conductive pattern layer over the insulating layer, wherein the at least one conductive pattern layer comprises a plurality of electrical connections to connect with the plurality of pins and at least one first I/O terminal of the conductive element.

* * * * *